United States Patent [19]
Shyong

[11] Patent Number: 5,694,066
[45] Date of Patent: Dec. 2, 1997

[54] LOW-JITTER, NON-SLIP CLOCK GENERATOR

[75] Inventor: Yee-Lee Shyong, Kaoshung, Taiwan

[73] Assignee: Industrial Research Institute, Hsinchu, Taiwan

[21] Appl. No.: 563,494

[22] Filed: Nov. 28, 1995

[51] Int. Cl.[6] ................................. H03K 19/094
[52] U.S. Cl. .................. 327/113; 327/115; 327/160; 327/299; 377/47
[58] Field of Search ............... 377/48–50, 47; 327/160, 299, 113, 115

[56] References Cited

U.S. PATENT DOCUMENTS

| 4,841,167 | 6/1989 | Saegusa | 327/299 |
| 5,345,109 | 9/1994 | Mehta | 327/115 |

FOREIGN PATENT DOCUMENTS

| 355066143 | 5/1980 | Japan | 327/115 |

*Primary Examiner*—Margaret Rose Wambach
*Attorney, Agent, or Firm*—Fish & Richardson P.C.

[57] ABSTRACT

A clock signal generator for converting a high speed clock signal to a low speed clock signal, the generator including a first counter receiving the high speed clock signal and counting the cycles thereof, the first counter being configured to count to a first preselected value and then generate an output signal indicating when the first preselected value is reached; a second counter receiving the high speed clock signal and counting the cycles thereof, the second counter being configured to count to a second preselected value and then generate an output signal indicating when the second preselected value is reached, wherein the first and second preselected values are different; and an m-state controller receiving the output signals from the first and second counters and generating the low-speed clock signal therefrom, the m-state generator periodically outputting a reset signal to reset the first and second counters to restart counts in each of those counters.

14 Claims, 3 Drawing Sheets

LOW-JITTER, NON-SLIP CLOCK GENERATOR

FIELD OF THE INVENTION

The invention relates to low-jitter, non-slip clock generators such as are utilized in terminal multiplexers which derive a low-frequency clock from a high speed synchronous signal.

BACKGROUND OF THE INVENTION

In traditional communication systems, people often used Phase-Lock-Loops (PLL) accompanied with large numbers of FIFO's to interface between high-speed and low-speed payloads. That is, the low-speed signals are multiplexed to the high-speed payload and the high-speed payload is demultiplexed to the low-speed signals.

FIG. 1 shows a traditional PLL clock generator. While the PLL is typically designed with a second- or higher- order feedback loop, it has the inherent disadvantage in that it fails to lock the target frequency steadily over an extended period of time. Therefore, large numbers of FIFO's are often needed to absorb the frequency disturbances. In addition to the problems of frequency instabilities, the system was also prone to overrun and/or underrun of the buffer.

SUMMARY OF THE INVENTION

The present invention devises a low-jitter and non-slip clock generator by using two sets of simple counters as a positive-cycle and a negative-cycle timing base, as well as a 6's-multiple-state control circuitry to manipulate the outputs of the two counters and generate a high quality, low-speed timing signal which can be used in synchronous and asynchronous communication systems. This clock generator eliminates the slip conditions introduced in the operation of asynchronous-to-synchronous conversion thus reduces the First-In-First-Out (FIFO) memory requirements. Because it is an all-digital clock generation circuit, it avoids the output errors caused by the tolerances typically found in discrete components of traditional designs and the tracking errors caused by the inherent second-order characteristics of PLL circuits. Consequently, this invention results in lower manufacturing costs and avoidance of data loss.

DESCRIPTION OF THE PREFERRED EMBODIMENTS

Figure 1:
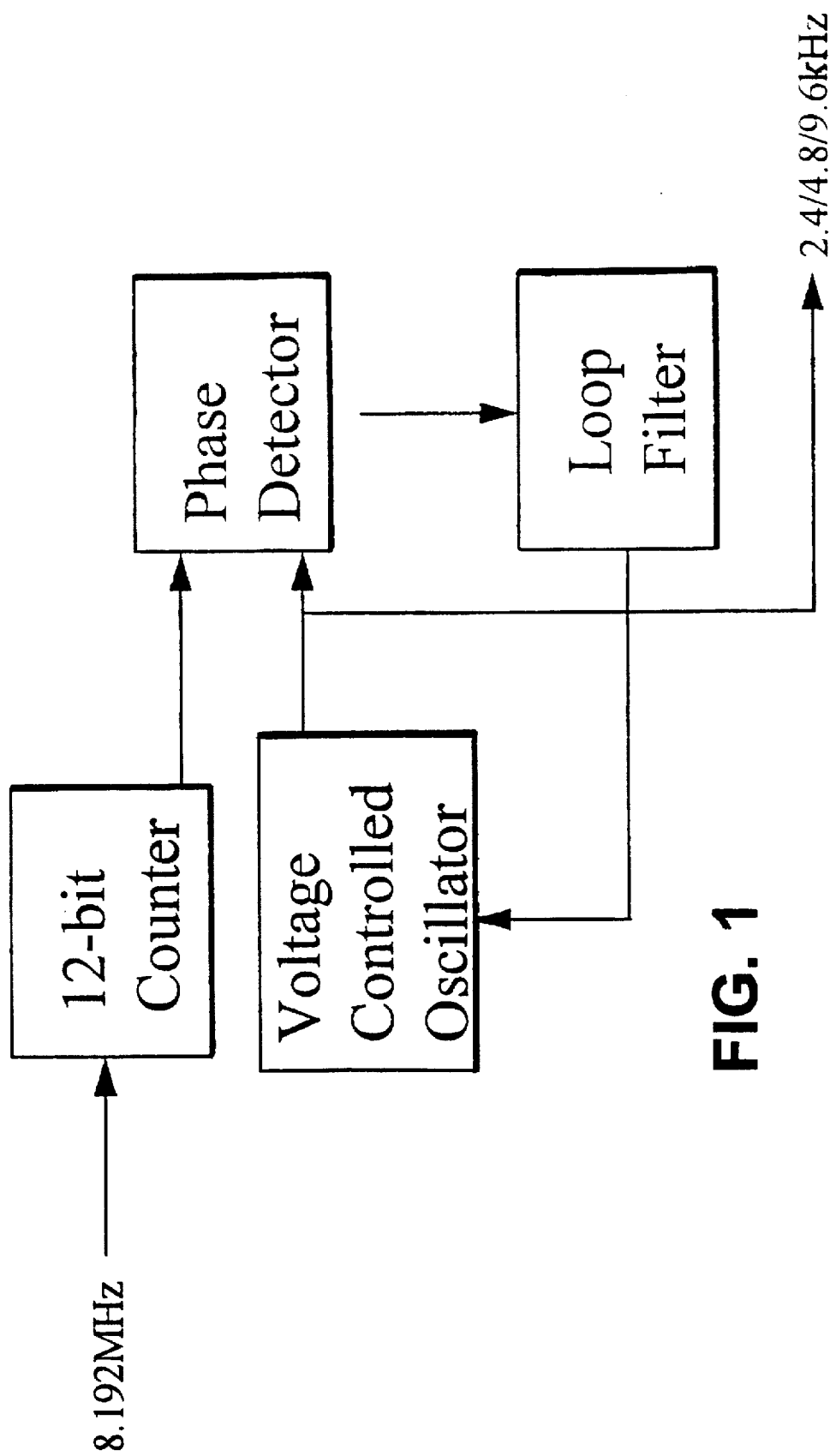
FIG. 1 is a conventional clock generator.
Figure 2:
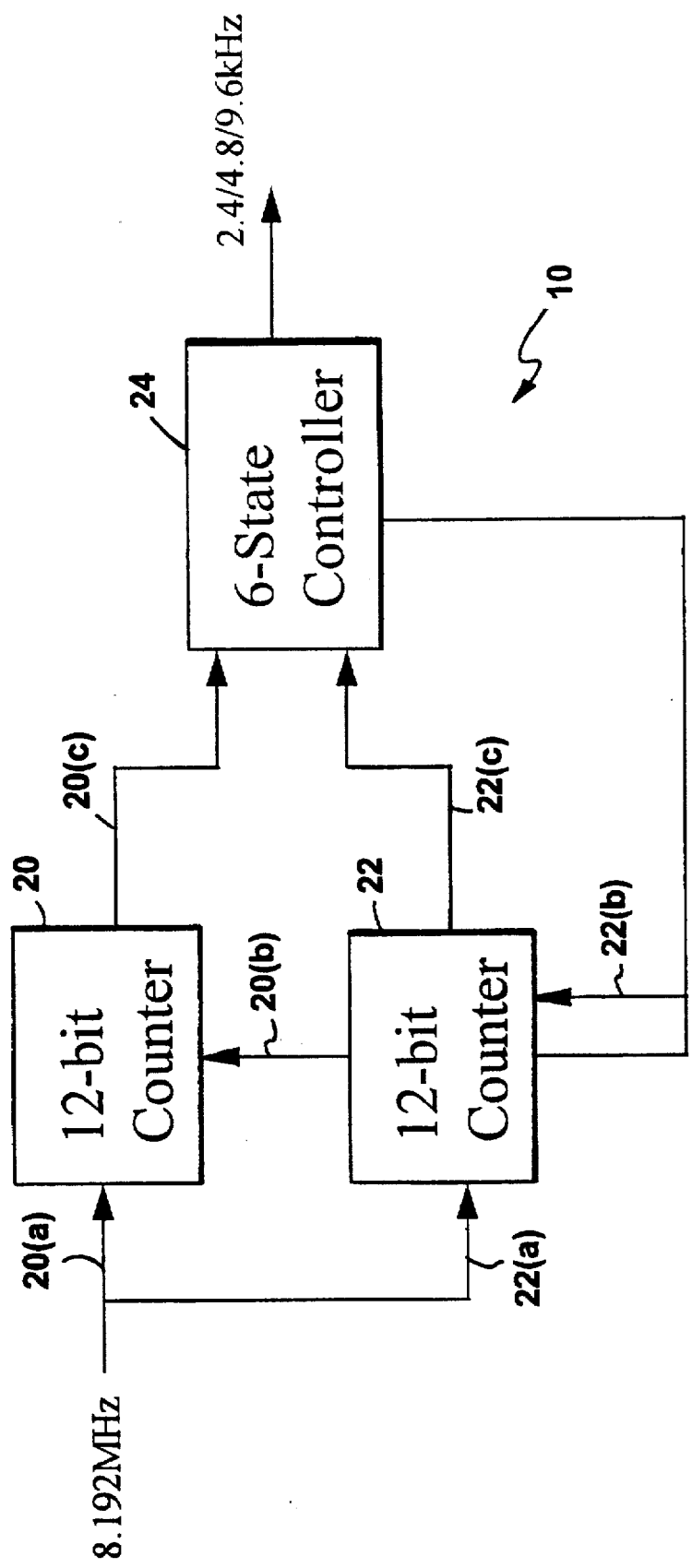
FIG. 2 is a block diagram of low-jitter, non-slip clock generator.

Referring to FIG. 2, a clock generator 10 in accordance with the invention includes two 12-bit down-counters 20 and 22 and a 6-state controller 24. Each of down-counters 20 and 22 includes an input line 20(a) and 22(a), a reset line 20(b) and 22(b), and an output line 20(c) and 22(c). Both input lines 20(a) and 22(a) receive a high speed clock signal, the counters count down the number of cycles of the input signal, and when the count reaches zero they output a signal to controller 24. Controller 24 uses reset lines 20(b) and 22(b) to reset the corresponding down-counters 20 and 22 to a preselected value to thereby restart the count down cycle.

In general, controller 24 toggles its output line between a high level and a low level and the timing of the transitions from one level to the other is determined by the input signals on the two input line. The output of controller 24 is a lower frequency clock signal, i.e., having a frequency that is a fraction of the input clock frequency.

Clock generator 10 converts a high-speed main operation clock, such as might be found on E1 and T1 lines of telecommunication trunk lines, to a low-speed clock signal such as might be used in modems. The high-speed main operation clock might be 8.192 MHz in the case of an E2 line, or 2.048 MHz in the case of an E1 line, or 1.544 MHz in the case of a T1 line. The low speed clock speeds that can be generated from this using the invention include 2.4 KHz, 4.8 KHz, 9.6 KHz, 19.2 KHz, 38.4 KHz, etc.

We first illustrate how the down conversion from a high speed clock signal at 8.192 MHz to a low speed, 2.4 KHz clock output signal is accomplished. To perform this conversion, it is necessary to divide the input clock signal frequency by 3413.333...( i.e., 8.192 MHz/2.4 KHz). Clock generator 10 accomplishes this through the two preset counters 20 and 22, each of which is setable to a different preset number, namely, 1706 and 1707. Each counter 20 and 22 counts the number of cycles which occur on its input line, and when that count reaches the preset value, it outputs a signal to controller 24. When the 6-state controller 24 detects a signal on a designated one of its input lines (determined by the state of the controller), it changes to the next state, toggles its output, and resets counters 20 and 22 to their preselected values so that they begin a new count down. As is explained below, counters 20 and 22 separately determine the duration of the positive and negative-going portions of the low-speed clock signal.

Figure 3:
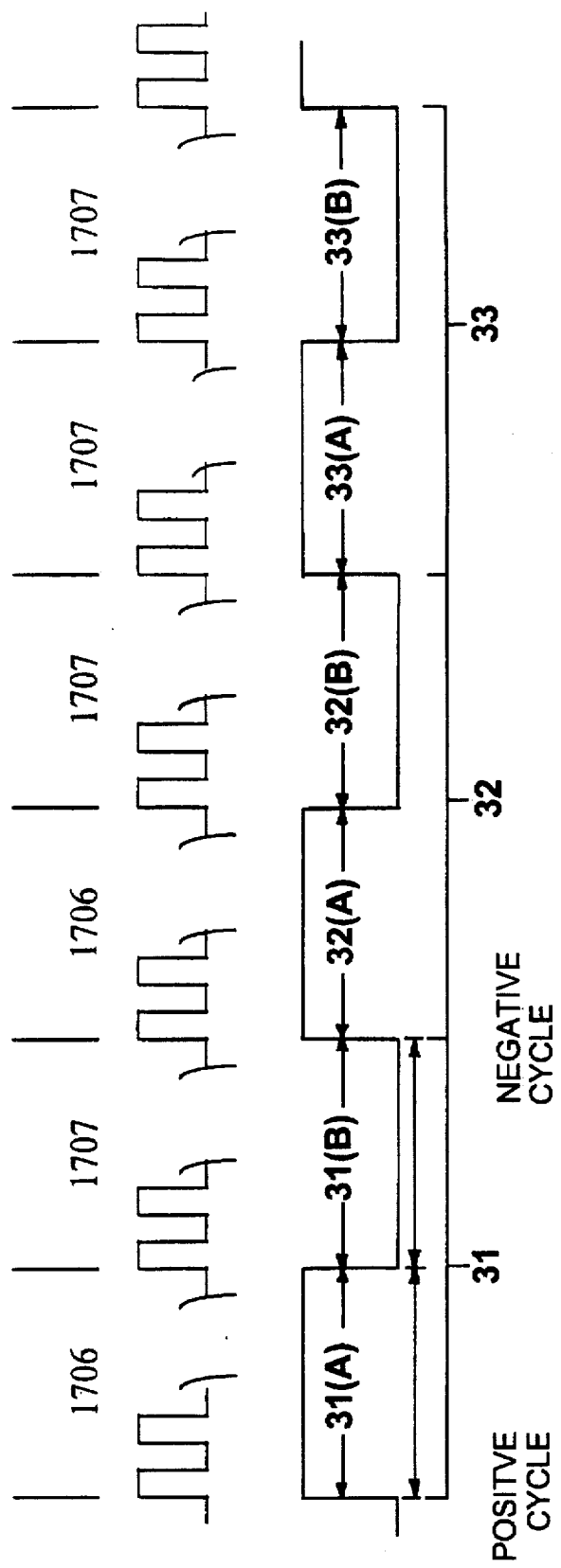
FIG. 3 is a signal timing diagram illustrating the operation of the generator in FIG. 2.

In the case of generating the 2.4 KHz clock signal from the 8.192 MHz clock signal, the 6-state controller is configured to output three complete cycles of the low speed clock signal before returning to its initial state and repeating that sequence. Each of the cycles is made up of a positive-going portion followed by a negative-going portion, referred to hereinafter as the positive and negative duty cycles, respectively. As shown in FIG. 3, the three complete cycles are labeled 31, 32, and 33 and the positive and negative duty cycles are identified by "A" and "B", respectively. In other words, the sequence that is output by controller 24 is 31(A), 31(B), 32(A), 32(B), 33(A), and 33(B); then it repeats. Each of these portions corresponds to a different one of the six states of the 6-state controller 24.

Down-counters 20 and 22 determine the duration of each of these duty cycles in accordance with the following chart:

| Cycle No. of 8.192 MHz | Counter Value (Positive Duty/State No.)/ Counter Value (Negative Duty/State No.) | Cycle No. of 2.4 KHz |
|---|---|---|
| 3413 | 1706 (Positive Duty/1)/1707(Negative Duty/2) | 1 |
| 3413 | 1706 (Positive Duty/3)/1707(Negative Duty/4) | 2 |
| 3414 | 1707 (Positive Duty/5)/1707(Negative Duty/6) | 3 |

In this chart, the left-most column indicates the number of cycles of the high speed clock signal that are represented by a corresponding complete cycle of the low speed clock signal, which is identified by the last column. The middle column indicates how the duration of the positive and negative portions of that low speed cycle are determined.

As indicated in this chart, there are six states of the 6-state controller, numbered here 1–6. States 1, 3, and 5, determine the duration of the positive duty cycles, labeled 31(A), 32(A) and 33(A) in FIG. 3, and states 2, 4, and 6 determine the duration of the negative duty cycles, labeled 31(B), 32(B) and 33(B) in FIG. 3. In state 1, controller 24 outputs a high level until counter 20 (i.e., the 1706 counter) reaches zero, then it toggles its output to low, resets both counters 20 and 22, and transitions to state 2. In state 2, controller 24 continues to output a low level until counter 22 (i.e., the 1707 counter) reaches zero, then it toggles its output to high, resets both counters 20 and 22, and transitions to state 3. The rest of the operation should now be apparent from the chart.

The sequence that is generated at the end of six states looks like the waveform shown in FIG. 3. The durations (in cycles of the 8.192 MHz clock signal) of each of the six portions or phases of the waveform are 1706, 1707, 1706, 1707, 1707, 1707, and 1707, respectively. Notice that the sum of these numbers is equal to 10240, which is equal to 3413.333333333 when divided by 3 (for the 3 cycles). In other words, on average each cycle of the slow speed clock is equal to 3413.333 cycles of the high speed clock, which equals a 2.4 KHz clock. Notice that of the three cycles, two have a durations that are slightly less than the duration of a cycle for a 2.4 KHz clock and the third has a duration that is slightly longer than the duration of a cycle for a 2.4 KHz clock signal. The resulting clock signal has a jitter of about 1/3413 UI (Unit Interval), which was very small.

The following are examples of how to generate 4.8, 9.6, and 38.4 KHz clock signals from 8.192 MHz by also using a 6-state controller and two down counters. For, generating a 4.8 KHz clock from a 8.192 MHz clock, the divisor must be 8192000/4800=1706 and ⅔. To produce this divisor, the 6-state controller should operate as follows:

| Cycle No. of 8.192 MHZ | Counter Value (Positive Duty/State No.)/ Counter Value (Negative Duty/State No.) | Cycle No. of 4.8 KHz |
|---|---|---|
| 1706 | 853 (Positive Duty/1)/853(Negative Duty/2) | 1 |
| 1707 | 853 (Positive Duty/3)/854(Negative Duty/4) | 2 |
| 1707 | 853 (Positive Duty/5)/854(Negative Duty/6) | 3 |

In this case, down counters, and, are preset to 853 and 854, rather than 1706 and 1707 as for the previous example. The resulting jitter value is 1/1706=0.0005861 UI.

For generating a 9.6 KHz clock from a 8.192 MHz clock, the divisor must be 8192000/9600=853 and ⅓. To produce divisor, the 6-state controller should operate as follows:

| Cycle No. of 8.192 MHZ | Counter Value (Positive Duty/State No.)/ Counter Value (Negative Duty/State No.) | Cycle No. of 9.6 KHz |
|---|---|---|
| 853 | 426 (Positive Duty/1)/427(Negative Duty/2) | 1 |
| 853 | 426 (Positive Duty/3)/427(Negative Duty/4) | 2 |
| 854 | 427 (Positive Duty/5)/427(Negative Duty/6) | 3 |

In this case, the resulting jitter value is 1/853=0.0011723 UI.

Finally, for generating a 38.4 KHz clock from a 8,192 MHz clock, the divisor must be 8192000/38400=213 and ⅓. To produce divisor, the 6-state controller should operate as follows:

| Cycle No. of 8.192 MHZ | Counter Value (Positive Duty/State No.)/ Counter Value (Negative Duty/State No.) | Cycle No. of 38.4 KHZ |
|---|---|---|
| 213 | 106 (Positive Duty/1)/107(Negative Duty/2) | 1 |
| 213 | 106 (Positive Duty/3)/107(Negative Duty/4) | 2 |
| 214 | 107 (Positive Duty/5)/107(Negative Duty/6) | 3 |

The resulting jitter value is 1/213=0.00469 UI.

Other embodiments are within the following claims.

What is claimed is:

1. A clock signal generator for converting a high speed clock signal to a low speed clock signal, said generator comprising:

a first counter receiving the high speed clock signal and counting the cycles thereof, said first counter including a reset line through which the first counter is reset and an output line, and said first counter being configured to count to a first preselected value and then generate an output signal on said output line of the first counter indicating when the first preselected value is reached;

a second counter receiving the high speed clock signal and counting the cycles thereof, said second counter including a reset line through which the second counter is reset and an output line, and said second counter being configured to count to a second preselected value and then generate an output signal on said output line of the second counter indicating when the second preselected value is reached, wherein the first and second preselected values are different; and an m-state controller, connected to the output lines of the first and second counters, receiving the output signals from the first and second counters and generating the low-speed clock signal therefrom, said m-state generator periodically outputting a reset signal onto the reset lines of the first and second counters to restart counts in each of said first and second counter, and wherein m is an integer.

2. The clock signal generator of claim 1 wherein said first and second counters are down-counters which reset to corresponding preselected values in response to receiving said reset signal and then count down to zero.

3. The clock signal generator of claim 1 wherein the m-state controller, in response to receiving output signals from the first and second counters, generates multiple cycles of a square wave, wherein each cycle of that square wave has a positive-going portion and a negative-going portion, and wherein the duration of the positive-going and negative-going portions of each cycle are determined by a corresponding one of the first and second counters.

4. The clock signal generator of claim 1 wherein m equals 6.

5. The clock signal generator of claim 1 wherein the first preselected value is 1706 and the second preselected value is 1707.

6. The clock signal generator of claim 1 wherein the first preselected value is 853 and the second preselected value is 854.

7. The clock signal generator of claim 1 wherein the first preselected value is 426 and the second preselected value is 427.

8. The clock signal generator of claim 1 wherein the first preselected value is 106 and the second preselected value is 107.

9. The clock signal generator of claim 1 wherein the m-state controller generates m/2 cycles of the low speed clock signal and then repeats those m/2 cycles of the low speed clock signal.

10. The clock signal generator of claim 1 wherein the m-state controller generates multiple cycles of a square wherein each cycle of that square wave has a positive-going portion and a negative going portion, and wherein each state of said m-state controller corresponds to a different one of the positive- going and negative-going portions of the square wave.

11. The clock generator of claim 1 wherein the frequency of the low speed clock signal is equal to the frequency of the high speed clock signal divided by a n, wherein n has real, positive, non-integer value.

12. The clock generator of claim 11 wherein n equals 3413⅓.

13. The clock generator of claim 1 wherein the frequency of the high speed clock signal is selected from the group consisting of 8.192 MHz, 2.048 MHz, and 1.544 MHz and the frequency of the low speed clock signal is selected from the group consisting of 2.4 KHz, 4.8 KHz, 9.6 KHz, 19.2 KHz, 38.4 KHz.

14. The clock generator of claim 1 wherein the m-state controller periodically restarts both the first and second counters at the same times.

* * * * *